United States Patent
Yamasita

[11] Patent Number: 6,111,460
[45] Date of Patent: Aug. 29, 2000

[54] VACUUM TUBE DIFFERENTIAL PREAMPLIFIER HAVING A TRANSFORMER WITH A CENTER TAP

[75] Inventor: Fujio Yamasita, Tokyo, Japan

[73] Assignee: Wako Technical Co., Ltd., Tokyo, Japan

[21] Appl. No.: 09/069,977

[22] Filed: Apr. 30, 1998

[30] Foreign Application Priority Data

Jul. 28, 1997 [JP] Japan ..................... 9-217172

[51] Int. Cl.$^7$ ..................................... H03F 3/45
[52] U.S. Cl. ............................. 330/69; 330/252
[58] Field of Search .............. 330/69, 252, 165, 330/168, 169, 171

[56] References Cited

U.S. PATENT DOCUMENTS

| | | | |
|---|---|---|---|
| 2,677,729 | 5/1954 | Mayne | 179/171 |
| 2,931,901 | 4/1960 | Markusen | 250/27 |
| 3,416,088 | 12/1968 | Baldwin | 330/3 |
| 4,713,624 | 12/1987 | Smith | 330/118 |

*Primary Examiner*—Robert Pascal
*Assistant Examiner*—Henry Choe
*Attorney, Agent, or Firm*—McDermott, Will & Emery

[57] ABSTRACT

The present invention provides a preamplifier, by which it is possible to prevent influence of noise components when there are noise components in power line. There is provided a transformer having a primary winding with a center tap and a secondary winding on output side, and the primary winding of the transformer is connected between plates of two vacuum tubes for performing differential amplification, and positive voltage is applied on the center tap of the primary winding. A switch may be arranged in such manner that input signal and output signal can be separately set to balanced state or unbalanced state.

25 Claims, 3 Drawing Sheets

6,111,460

VACUUM TUBE DIFFERENTIAL PREAMPLIFIER HAVING A TRANSFORMER WITH A CENTER TAP

BACKGROUND OF THE INVENTION

1. Field of the Invention

The present invention relates to a preamplifier, and in particular to improvement of a vacuum tube preamplifier of differential amplification type.

2. Description of Prior Art

In a differential amplification type vacuum tube preamplifier for audio application, two vacuum tubes are combined together to achieve differential amplification. Positive voltage is applied to plates of the two vacuum tubes via plate resistor, and output signal is picked up from the plate of one of the vacuum tubes. FIG. 5 shows an arrangement of a conventional vacuum tube differential preamplifier as described above.

In a conventional differential preamplifier as described above, problem arises in that noise components are intermingled via power line and quality of output signal is deteriorated. Specifically, in a preamplifier to amplify audio signal, the influence of distortion or noise must be reduced as much as possible because intermingling of noise from power source causes serious problem and quality of audio signal is deteriorated.

SUMMARY OF THE INVENTION

In view of the above, it is an object of the present invention to provide a preamplifier, by which it is possible to prevent the influence of intermingling of noise components as much as possible when there are noise components in power line.

To attain the above object, the preamplifier according to the present invention comprises two vacuum tubes for differential amplification, and a transformer having a primary winding with a center tap and a secondary winding on output side, whereby said primary winding of the transformer is connected between plates of said vacuum tubes, and positive voltage is applied on the center tap of the primary winding. Also, it is advantageous if it is designed in such manner that input signal and output signal can be set to balanced state or unbalanced state. According to the present invention, input signal and output signal can be switched over to balanced state or unbalanced state in addition to the adoption of transformer having a center tap as described above.

Specifically, the preamplifier according to the present invention comprises:

a first vacuum tube having a grid connected to an input terminal either directly or via a first resistor and having a cathode connected to a negative power terminal via a second resistor;

a second vacuum tube having a grid connected to the earthing and having a cathode connected to said negative power terminal via a third resistor;

a fourth resistor connected between the grid of said first vacuum tube and said earthing; and a transformer having a primary winding with a center tap, one end of the primary winding being connected to a plate of said first vacuum tube, the other end of said primary winding being connected to a plate of said second vacuum tube, the center tap of said primary winding being connected to a positive power terminal, and one end of the secondary winding being connected to said earthing.

Also, the preamplifier according to the present invention comprises:

a first vacuum tube having a grid connected to a first input terminal either directly or via a first resistor and having a cathode connected to a negative power terminal via a second resistor;

a second vacuum tube having a grid connected to a second input terminal either directly or via a third resistor and having a cathode connected to said negative power terminal via a fourth resistor;

a fifth resistor connected between the grid of said first vacuum tube and the earthing;

a sixth resistor connected between the grid of said second vacuum tube and the earthing; and a transformer having a primary winding with a center tap and a secondary winding with a center tap, one end of the primary winding being connected to a plate of said first vacuum tube, the other end of said primary winding being connected to a plate of said second vacuum tube, the center tap of said primary winding being connected to a positive power terminal, and the center tap of said secondary winding being connected to the earthing.

Further, the preamplifier according to the present invention comprises:

a first vacuum tube having a grid connected to a first input terminal either directly or via a first resistor and having a cathode connected to a negative power terminal via a second resistor;

a second vacuum tube having a grid connected to a second input terminal either directly or via a third resistor and having a cathode connected to said negative power terminal via a fourth resistor;

a fifth resistor connected between the grid of said first vacuum tube and the earthing;

a sixth resistor connected between the grid of said second vacuum tube and the earthing;

a transformer having a primary winding with a center tap, one end of said primary winding being connected to a plate of said first vacuum tube, the other end of said primary winding being connected to a plate of said second vacuum tube, the center tap of said primary winding being connected to a positive power terminal, and one end of said secondary winding being connected to the earthing;

a first switch connected to said second input terminal and the earthing; and a second switch connected between the grid of said second vacuum tube and the earthing.

Also, the preamplifier according to the present invention comprises:

a first vacuum tube having a grid connected to a first input terminal either directly or via a first resistor and having a cathode connected to a negative power terminal via a second resistor;

a second vacuum tube having a grid connected to a second input terminal either directly or via a third resistor and having a cathode connected to said negative power terminal via a fourth resistor;

a fifth resistor connected between the grid of said first vacuum tube and the earthing;

a sixth resistor connected between the grid of said second vacuum tube and the earthing;

a transformer having a primary winding with a center tap and a secondary winding with a center tap, one end of said primary winding being connected to a plate of said first vacuum tube, the other end of said primary winding being connected to a plate of said second vacuum tube, the center tap of said primary winding being connected to a positive power terminal, and one end of said secondary winding being connected to a first output terminal;

a first switch connected between said second input terminal and the earthing;

a second switch connected between the grid of said second vacuum tube and the earthing;

a third switch for selectively connecting the other end of the secondary winding of said transformer either to the second output terminal or to the earthing; and a fourth switch connected between the center tap of said transformer and the earthing.

BRIEF DESCRIPTION OF THE DRAWINGS

The other features and advantages of the present invention will become more apparent by embodiments to be explained in connection with the attached drawings.

DETAILED DESCRIPTION OF THE PREFERRED EMBODIMENTS

Figure 1:
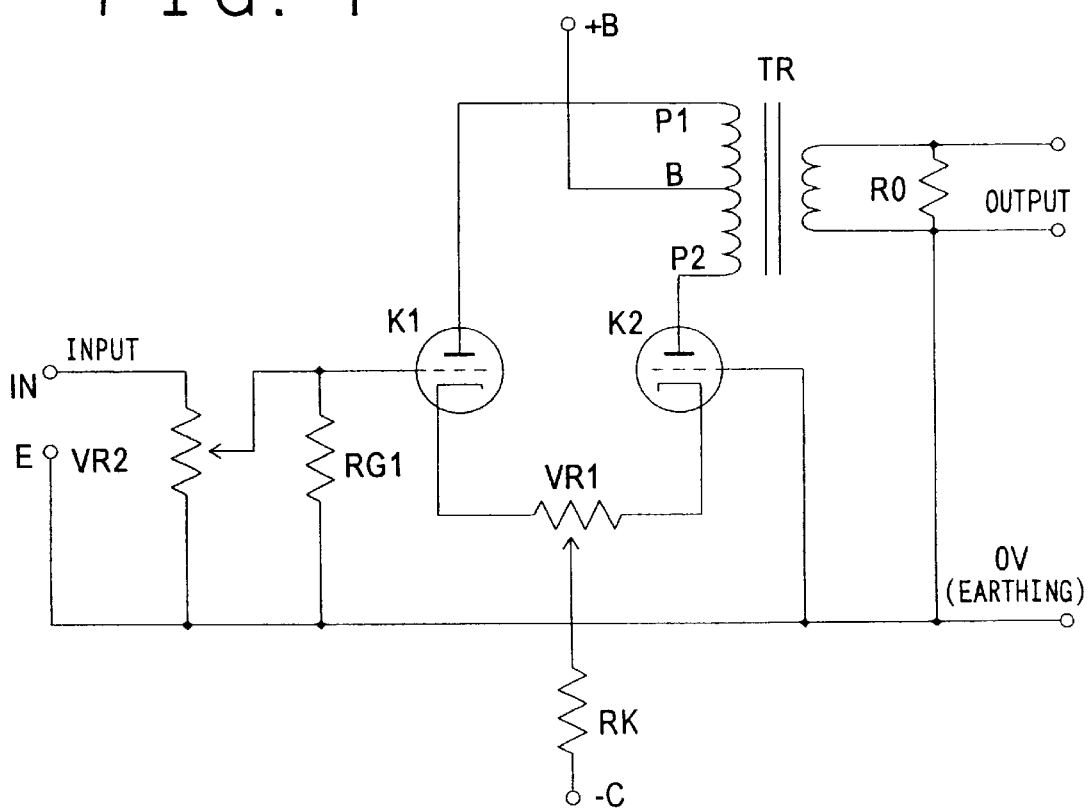
FIG. 1 is a wiring diagram of a first embodiment of a preamplifier according to the present invention.

In the following, description will be given on the preferred embodiments of the present invention referring to the attached drawings. FIG. 1 is a wiring diagram of a first embodiment of a preamplifier according to the present invention. In FIG. 1 and other figures, only the channel on one side of a stereo system is shown, and components for one more channel are required for the use as a stereo system. In FIG. 1, K1 and K2 represent a first vacuum tube and a second vacuum tube respectively. Reference symbol VR2 represents a variable resistor with two fixed ends connected to an input terminal IN and the earthing respectively, and its movable terminal is connected to a grid of the first vacuum tube K1. The input terminal IN is used for input of a signal on one side channel, and signal of the other channel is supplied between the input terminal IN and an earthing terminal E. The earthing corresponds to 0 V of a power source (not shown).

A resistor RG1 is connected between a grid of the first vacuum tube K1 and the earthing, and a grid of the second vacuum tube K2 is directly connected to the earthing. Between the cathode of the first vacuum tube K1 and the cathode of the second vacuum tube K2, two fixed ends of a variable resistor VR1 are connected, and its movable terminal is connected to a negative voltage terminal −C via a resistor RK. The plate of the first vacuum tube K1 and the plate of the second vacuum tube K2 are connected to two ends P1 and P2 of a primary winding of a transformer TR respectively. The primary winding has a center tap B, which is connected to a positive voltage terminal +B of the power source. A resistor RO is connected between two terminal of the second winding of the transformer TR, and one of the terminals is connected to the earthing.

The first embodiment of the invention shown in FIG. 1 is operated as follows: Electric current from the positive voltage terminal +B of the power source passes through the center tap B of the primary winding of the transformer TR and flows toward the two terminals P1 and P2 of the primary winding. Electric current further flows from the plates of the two vacuum tubes K1 and K2 to cathodes and further toward the negative voltage terminal −C of the power source via the variable resistor VR1 and the resistor RK, thus returning to the power source. If noise components are intermingled in the electric current from the power source, the noise components are equally distributed in two directions of the primary winding from the center tap. When seen from the secondary side, the noise components offset each other and are not transmitted to the secondary side. Therefore, harmful noise components existing in the power source are not transmitted to the secondary side of the transformer TR and are not overlapped on the output signal. Also, the first vacuum tube K1 and the second vacuum tube K2 operate in reverse phase to each other, and the two vacuum tubes K1 and K2, being connected to two terminals with the center tap B of the transformer TR at the center, operate in the so-called seesaw manner, and differential amplification is performed. Being differentially amplified, audio signal flows from the plate of the first vacuum tube K1 to the plate of the second vacuum tube or in reverse direction. As a result, the audio signal flowing to the primary winding of the transformer TR is transmitted to the secondary side.

Figure 2:
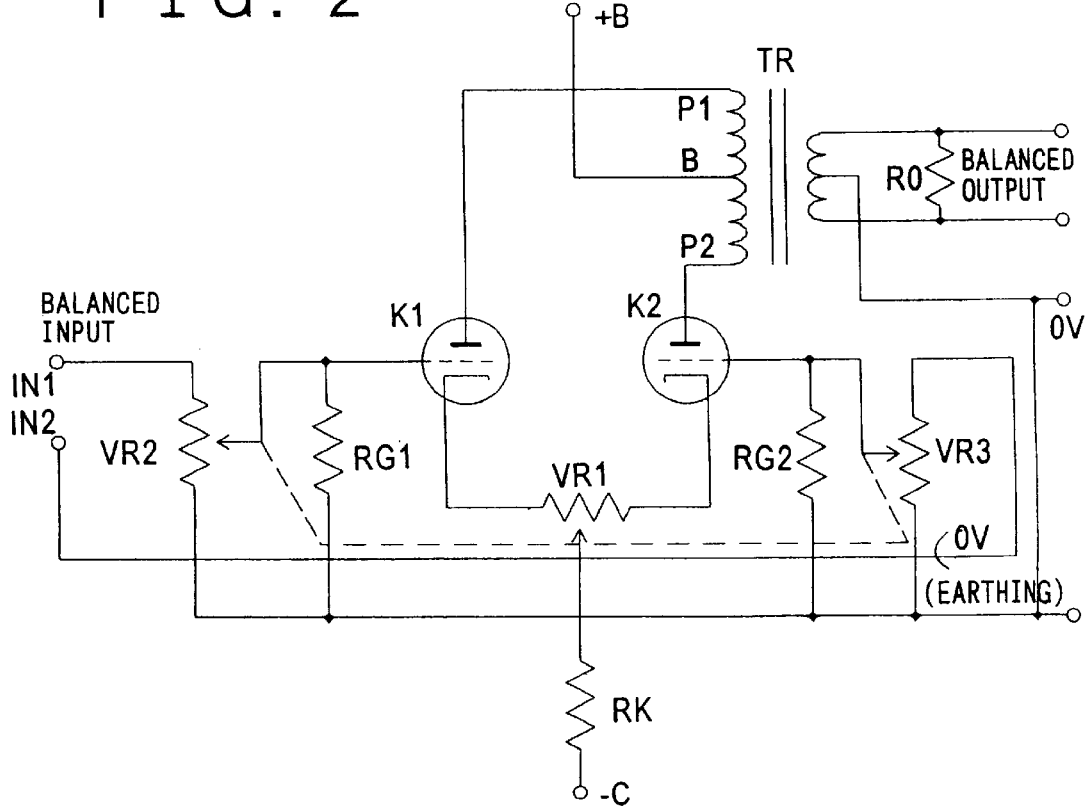
FIG. 2 is a wiring diagram of a second embodiment of a preamplifier according to the present invention.

Next, description will be given on a second embodiment of the present invention referring to FIG. 2. The second embodiment is arranged in such manner that input signal and output signal are kept in balanced state. Description will be given here on the difference from the first embodiment. The balanced input signal is supplied between a first input terminal IN1 and a second input terminal IN2. The first input terminal IN1 behaves in the same manner as the input terminal IN of the first embodiment, while the second input terminal IN2 is not connected to the earthing and is connected to one of fixed terminals of a variable resistor VR3, and the other fixed terminal is connected to the earthing. The grid of the second vacuum tube is not connected to the earthing, but it is connected to a movable terminal of the variable resistor VR3 and is connected to the earthing via a resistor RG2. Further, the secondary winding of the transformer TR is provided with a center tap CT. Two terminals of the secondary winding are not connected to the earthing but they are connected to balanced output terminals OUT1 and OUT2. Instead, the center tap CT of the secondary winding is connected to the earthing. Also, two variable resistors VR2 and VR3 are interlocked with each other as shown by broken line. The other arrangement is the same as in the first embodiment.

The second embodiment is different from the first embodiment only in that input signal and output signal are kept in balanced state. Operation to remove the noise components is the same as in the first embodiment, and detailed description is not given here.

Next, description will be given on a third embodiment of the present invention referring to FIG. 3. The third embodiment is arranged in such manner that the arrangement of the first and the second embodiments is further evolved and that input signal and output signal can be separately switched over to unbalanced state or balanced state. Description will be given on the difference from the second embodiment. A second input terminal IN2 is selectively connected to the earthing via a first switch SW1, and the grid of a second vacuum tube K2 is selectively connected to the earthing via a second switch SW2. Further, one terminal of the secondary winding of the transformer TR is selectively connected to the earthing via a third switch SW3. The other arrangement is the same as in the second embodiment.

Figure 3:
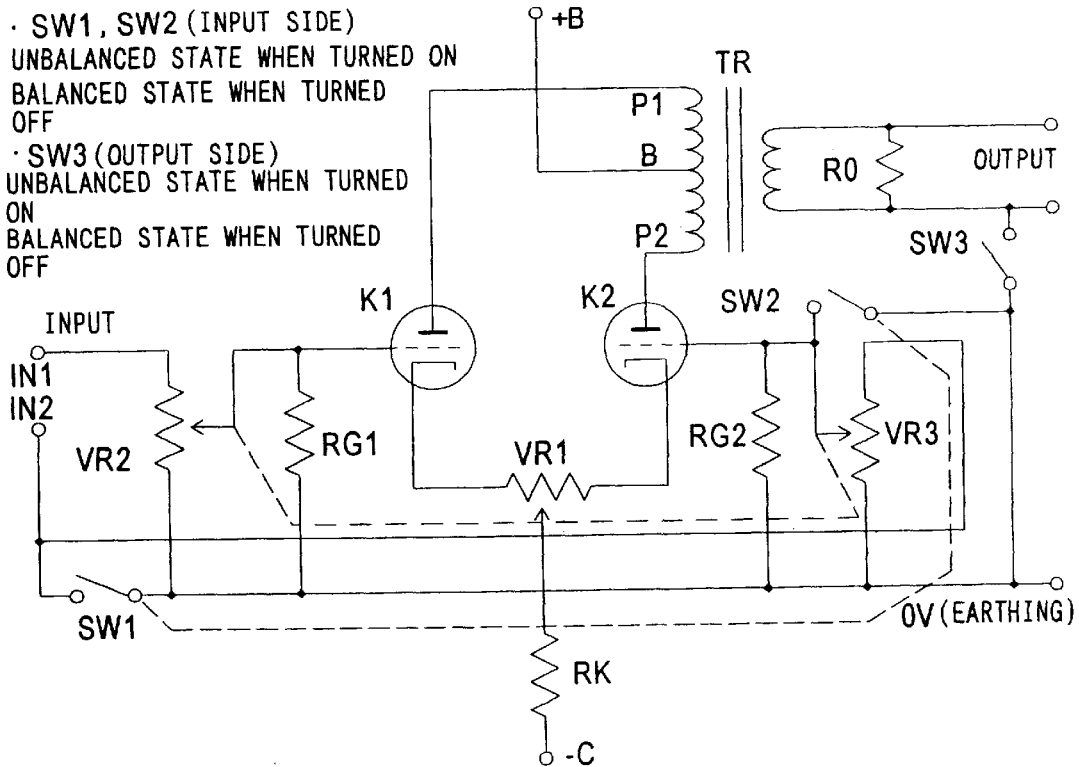
FIG. 3 is a wiring diagram of a third embodiment of a preamplifier according to the present invention.

It is preferable that the switches SW1 and SW2 are interlocked with each other as shown by broken line in FIG. 3, and these are switched over to input side respectively. When turned on, it is set to unbalanced state and when turned off, it is set to balanced state. The switch SW3 is used to switch over to output side. When it is turned on, it is set to unbalanced state, and when turned off, it is set to balanced state. The third embodiment is different from the first and the second embodiments only in that input signal and output signal can be separately switched over between unbalanced state and balanced state, and operation to remove noise components is the same as in the above two embodiments. Thus, detailed description is not given here. The third embodiment is advantageous in that input signal and output signal can be easily set to unbalanced state or balanced state by the switches SW1, SW2 and SW3. In FIG. 3, the switches SW1, SW2 and SW3 are at positions in balanced state.

Figure 4:
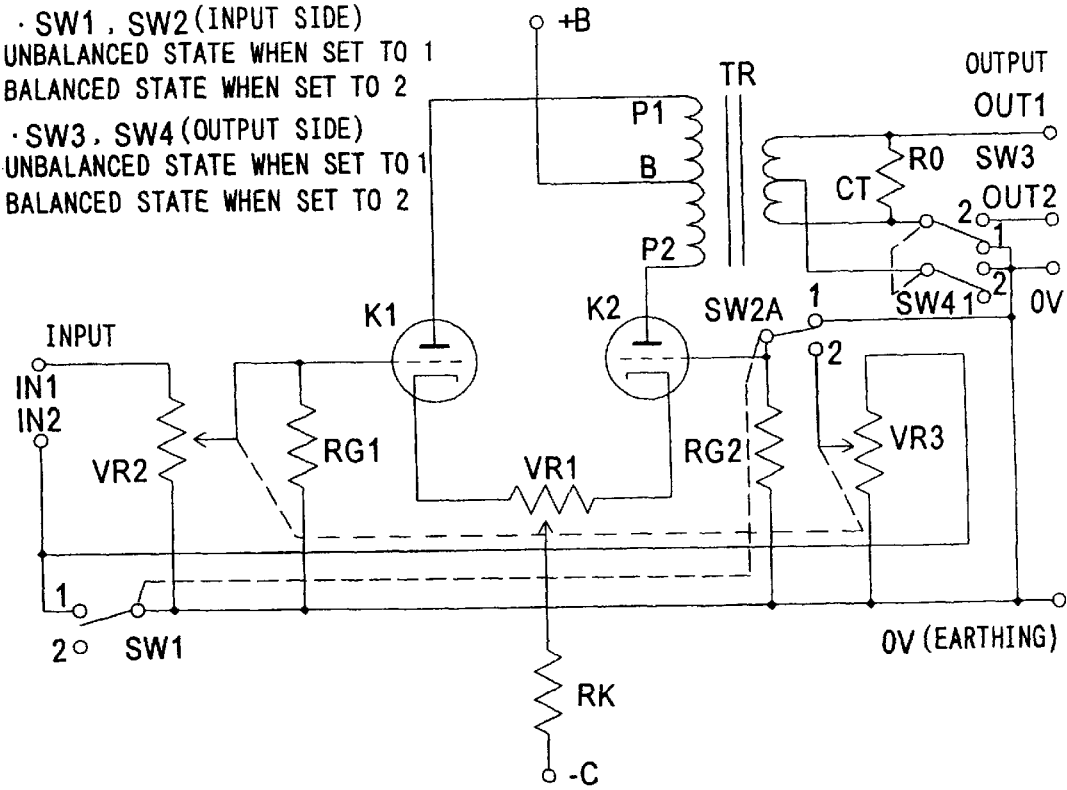
FIG. 4 is a wiring diagram of a fourth embodiment of a preamplifier according to the present invention.
Figure 5:
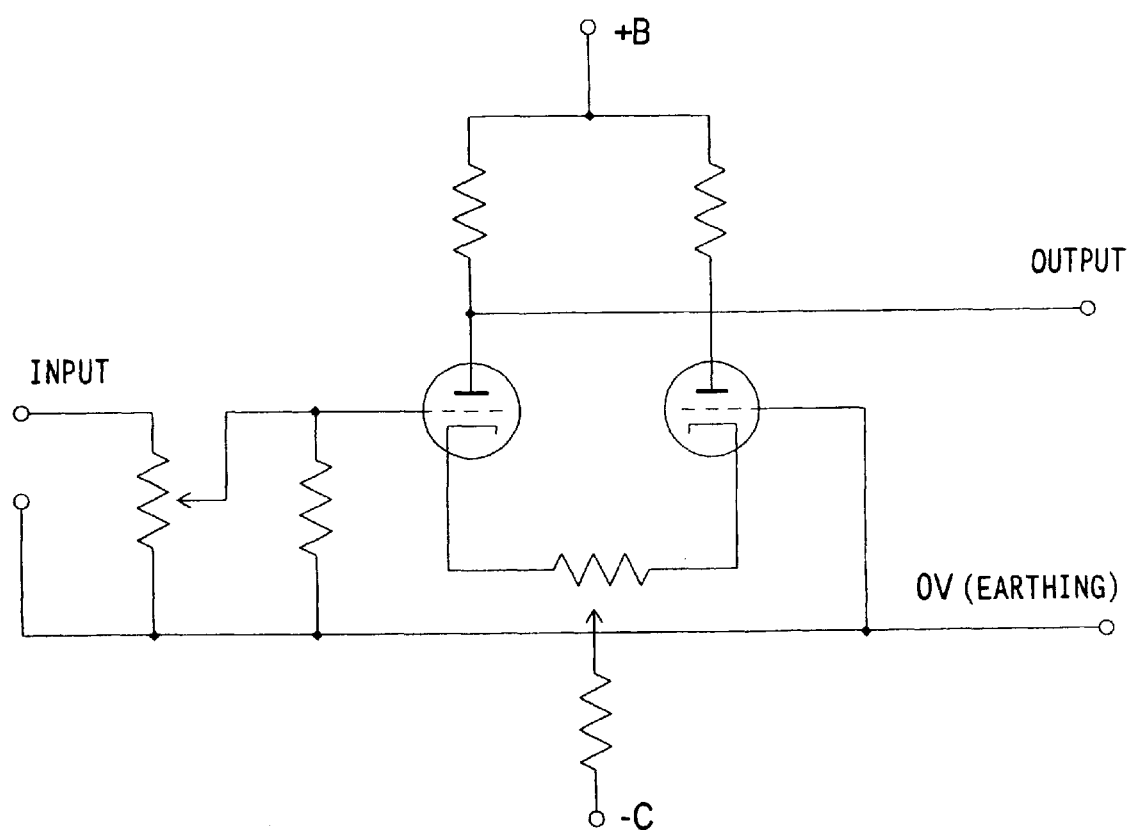
FIG. 5 is a wiring diagram of a conventional type preamplifier.

Next, description will be given on a fourth embodiment of the present invention referring to FIG. 4. In the fourth embodiment, the arrangement of the third embodiment is further evolved, and it is the same as the third embodiment in that input signal and output signal are separately switched over to unbalanced state or balanced state. Description will be given now on the difference from the third embodiment. The grid of the second vacuum tube K2 is selectively connected to either to the earthing or to a movable terminal of a variable resistor VR3 via a second switch SW2A, and the secondary winding of the transformer TR has a center tap (CT). This center tap is selectively connected to the earthing via a fourth switch SW4, and a third switch SW3 is provided in such manner that one end of the secondary winding of the transformer TR is selectively connected either to a second output terminal OUT2 or to the earthing. It is the same as in the third embodiment in that the other end of the secondary winding of the transformer TR is fixedly connected to a first output terminal OUT1. Among these switches, it is preferable that the two switches SW1 and SW2A are interlocked with each other as shown by broken line in FIG. 4. Also, it is preferable that the switches SW3 and SW4 are interlocked with each other as shown by broken line in the figure. The other arrangement is the same as in the first embodiment, except that the grid of the second vacuum tube is not directly connected to the movable terminal of the variable resistor VR3.

The switches SW1 and SW2A are used to switch over to input side as in the third embodiment. When set to "1", it is turned to unbalanced state, and when set to "2", it is turned to balanced state. For convenience, the switch SW1 is shown as a switch to switch over between "1" and "2", while it may be an on-off switch as shown in FIG. 3. The switches SW3 and SW4 are used to switch over the output side. When set to "1", it is turned to unbalanced state, and when set to "2", it is turned to balanced state. Operation of the switch SW1 to eliminate noise components in the fourth embodiment is the same as in the above embodiments, and detailed description is not given here. In the fourth embodiment, by the interlocked two switches SW1 and SW2A and by the interlocked two switches SW3 and SW4, input signal and output signal can be selectively set to unbalanced state or balanced state, and this is very convenient as in the third embodiment. Although the third embodiment is inconvenient in that sign of the terminal changes by switching over the switches, while such inconvenience is eliminated in the fourth embodiment. In FIG. 4, the switches SW1, SW2A, SW3 and SW4 are at positions in unbalanced state.

In all of the above embodiments, the following are preferable as the type of vacuum tube, resistor, transformer and power rating:

| | |
|---|---|
| Vacuum tubes K1 and K2 | 12BH7A |
| Resistor RG | 100 kΩ |
| Resistors RG1 and RG2 | 100 kΩ |
| Resistor RK | 15 kΩ |
| Resistor RO | 1.8 kΩ |
| Variable resistor VR1 | 500 Ω |
| Variable resistors VR2 and VR3 | 100 kΩ |
| Primary winding of transformer TR | 20 kΩ |
| Secondary winding of transformer TR | 1.2 kΩ |
| Voltage of positive voltage terminal +B | 103 V |
| Voltage of negative voltage terminal −C | −128 V |

In the above embodiments, triode is used as the two vacuum tubes K1 and K2, while the present invention is not limited to this, and the two vacuum tubes for differential amplification may be diodes or may be of other type. The resistor RO connected between two terminals on the secondary side of the transformer TR may not be used depending upon the arrangement of power amplifier, to which the preamplifier is connected. That is, in case of the power amplifier generally in use, input resistor is as high as 47 to 100 kΩ, and adequate load is not applied on the preamplifier. Thus, it is preferable to use the resistor RO. In case output signal of the preamplifier is given to a circuit, on which an adequate load (e.g. a load of about 1.2 kΩ) is applied, this resistor RO is not required.

In all of the above embodiments, only the grids of the first vacuum tube K1 and the second vacuum tube K2 are connected to the earthing via resistor. Instead of or in addition to the resistor, resistor may be placed between the cathode and the earthing or between the plate and the positive power terminal. If not volume adjustment is required, the variable resistors VR1 and VR2 may be designed as fixed resistors so that input signal may be applied directly on the grid.

As described above, it is possible according to the present invention to provide a preamplifier, which can be designed in simple arrangement and by which it is possible to prevent influence of noise components of power line. Also, it is possible to arrange in such manner that input signal and output signal can be separately switched over between unbalanced state and balanced state.

What is claimed is:

1. A preamplifier comprising:

a first vacuum tube having a grid connected to an input terminal either directly or via a first resistor and having a cathode connected to a negative power terminal via a second resistor;

a second vacuum tube having a grid connected to an earthing and having a cathode connect to said negative power terminal via a third resistor;

a fourth resistor connected between the grid of said first vacuum tube and the earthing;

a transformer having a primary winding with a center tap, one end of the primary winding being connected to a plate of said first vacuum tube, the other end of said primary winding being connected to a plate of said second vacuum tube, the center tap of said primary winding being connected to a positive power terminal, and one end of the secondary winding being connected to the earthing; and a resistor connected between two ends of the secondary winding of said transformer.

2. A preamplifier according to claim 1, wherein said first resistor is a variable resistor having two fixed terminals connected between said input terminal and the earthing and having a movable terminal connected to the grid of said first vacuum tube.

3. A preamplifier according to claim 1, wherein said second resistor and said third resistor are variable resistors having two fixed terminals connected between a cathode of said first vacuum tube and a cathode of said second vacuum tube and having a movable terminal connected to said negative power terminal via a resistor.

4. A preamplifier comprising:

a first vacuum tube having a grid connected to a first input terminal either directly or via a first resistor and having a cathode connected to a negative power terminal via a second resistor;

a second vacuum tube having a grid connected to a second input terminal either directly or via a third resistor and having a cathode connected to said negative power terminal via a fourth resistor;

a fifth resistor connected between the grid of said first vacuum tube and the earthing;

a sixth resistor connected between the grid of said second vacuum tube and the earthing; and a transformer having a primary winding with a center tap and a secondary winding with a center tap, one end of the primary winding being connected to a plate of said first vacuum tube, the other end of said primary winding being connected to a plate of said second vacuum tube, the center tap of said primary winding being connected to a positive power terminal, and the center tap of said secondary winding being connected to the earthing.

5. A preamplifier according to claim 4, wherein said first resistor is a variable resistor having two fixed terminals connected between said input terminal and the earthing and having a movable terminal connected to the grid of said first vacuum tube.

6. A preamplifier according to claim 4, wherein said third resistor is a variable resistor having two fixed terminals connected between said second input terminal and the earthing and having a movable terminal connected to the grid of said second vacuum tube.

7. A preamplifier according to claim 4, wherein said first resistor is a first variable resistor having two fixed terminals connected between said first input terminal and the earthing and having a movable terminal connected to the grid of said first vacuum tube, said third resistor is a second variable resistor having two fixed terminals connected between said second input terminal and the earthing and having a movable terminal connected to the grid of said second vacuum tube, and said first variable resistor is interlocked with said second variable resistor.

8. A preamplifier according to claim 4, wherein said second resistor and said fourth resistor are variable resistors having two fixed terminals connected between a cathode of said first vacuum tube and a cathode of said second vacuum tube and having a movable terminal connected to said negative power terminal via a resistor.

9. A preamplifier according to claim 4, wherein there is further provided a resistor connected between two ends of the secondary winding of said transformer.

10. A preamplifier comprising:

a first vacuum tube having a grid connected to a first input terminal either directly or via a first resistor and having a cathode connected to a negative power terminal via a second resistor;

a second vacuum tube having a grid connected to a second input terminal either directly or via a third resistor and having cathode connected to said negative power terminal via a fourth resistor;

a fifth resistor connected between the grid of said first vacuum tube and the earthing;

a sixth resistor connected between the grid of said second vacuum tube and the earthing;

a transformer having a primary winding with a center tap, one end of said primary winding being connected to a plate of said first vacuum tube, the other end of said primary winding being connected to a plate of said second vacuum tube, the center tap of said primary winding being connected to a positive power terminal, and one end of said secondary winding being connected to the earthing;

a first switch connected to said second input terminal and the earthing; and a second switch connected between the grid of said second vacuum tube and the earthing.

11. A preamplifier according to claim 10, wherein said first resistor is a variable resistor having two fixed terminals connected between said input terminal and the earthing and having a movable terminal connected to the grid of said first vacuum tube.

12. A preamplifier according to claim 10, wherein said third resistor is a variable resistor having two fixed terminals connected between said second input terminal and the earthing and having a movable terminal connected to the grid of said second vacuum tube.

13. A preamplifier according to claim 10 wherein said first resistor is a first variable resistor having two fixed terminals connected between said first input terminal and the earthing and having a movable terminal connected to the grid of said first vacuum tube, said third resistor is a second variable resistor having two fixed terminals connected between said second input terminal and the earthing and having a movable terminal connected to the grid of said second vacuum tube, and said first variable resistor is interlocked with said second variable resistor.

14. A preamplifier according to claim 10, wherein said second resistor and said fourth resistor are variable resistors having two fixed terminals connected between a cathode of said first vacuum tube and a cathode of said second vacuum tube and having a movable terminal connected to said negative power terminal via a resistor.

15. A preamplifier according to claim 10, wherein there is further provided a resistor connected between two ends of the secondary winding of said transformer.

16. A preamplifier according to claim 10, wherein there is further provided a third switch connected between one end of the secondary winding of said transformer and the earthing.

17. A preamplifier according to claim 10, wherein said first switch is interlocked with said second switch.

18. A preamplifier comprising:

a first vacuum tube having a grid connected to a first input terminal either directly or via a first resistor and having a cathode connected to a negative power terminal via a second resistor;

a second vacuum tube having a grid connected to a second input terminal either directly or via a third resistor and having a cathode connected to said negative power terminal via a fourth resistor;

a fifth resistor connected between the grid of said first vacuum tube and the earthing;

a sixth resistor connected between the grid of said second vacuum tube and the earthing;

a transformer having a primary winding with a center tap and a secondary winding with a center tap, one end of said primary winding being connected to a plate of said first vacuum tube, the other end of said primary winding being connected to a plate of said second vacuum tube, the center tap of said primary winding being connected to a positive power terminal, and one end of said secondary winding being connected to a first output terminal;

a first switch connected between said second input terminal and the earthing;

a second switch connected between the grid of said second vacuum tube and the earthing;

a third switch for selectively connecting the other end of the secondary winding of said transformer either to the second output terminal or to the earthing; and a fourth switch connected between the center tap of said transformer and the earthing.

19. A preamplifier according to claim 18, wherein said first resistor is a variable resistor having two fixed terminals connected between said input terminal and the earthing and having a movable terminal connected to the grid of said first vacuum tube.

20. A preamplifier according to claim 18, wherein said third resistor is a variable resistor having two fixed terminals connected between said second input terminal and the earthing and having a movable terminal connected to the grid of said second vacuum tube.

21. A preamplifier according to claim 18, wherein said first resistor is a first variable resistor having two fixed terminals connected between said first input terminal and the earthing and having a movable terminal connected to the grid of said first vacuum tube, said third resistor is a second variable resistor having two fixed terminals connected between said second input terminal and the earthing and having a movable terminal connected to the grid of said second vacuum tube, and said first variable resistor is interlocked with said second variable resistor.

22. A preamplifier according to claim 18, wherein said second resistor and said fourth resistor are variable resistors having two fixed terminals connected between a cathode of said first vacuum tube and a cathode of said second vacuum tube and having a movable terminal connected to said negative power terminal via a resistor.

23. A preamplifier according to claim 18, wherein there is further provided a resistor connected between two ends of the secondary winding of said transformer.

24. A preamplifier according to claim 18, wherein said first switch is interlocked with said second switch.

25. A preamplifier according to claim 18, wherein said first switch, said third switch and said fourth switch are interlocked with each other.

* * * * *

UNITED STATES PATENT AND TRADEMARK OFFICE
CERTIFICATE OF CORRECTION

PATENT NO.  : 6,111,460
DATED       : August 29, 2000
INVENTOR(S) : Fujio YAMASITA It is certified that error appears in the above-identified patent and that said Letter Patent is hereby corrected as shown below:

On the Title page:

Section [73], add --Fujio Yamasita--, as an Assignee.

Signed and Sealed this

Fifteenth Day of May, 2001

*Attest:*

NICHOLAS P. GODICI

*Attesting Officer*    *Acting Director of the United States Patent and Trademark Office*